(12) United States Patent
Choi et al.

(10) Patent No.: US 8,736,075 B2
(45) Date of Patent: May 27, 2014

(54) SEMICONDUCTOR CHIP MODULE, SEMICONDUCTOR PACKAGE HAVING THE SAME AND PACKAGE MODULE

(75) Inventors: Hyung Ju Choi, Seoul (KR); Mun Aun Hyun, Icheon-si (KR); Jong Hyun Kim, Seoul (KR); Hyeon Ji Baek, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 245 days.

(21) Appl. No.: 13/249,569

(22) Filed: Sep. 30, 2011

(65) Prior Publication Data
US 2012/0187560 A1 Jul. 26, 2012

(30) Foreign Application Priority Data
Jan. 24, 2011 (KR) ........................ 10-2011-0006900

(51) Int. Cl.
*H01L 23/02* (2006.01)
*H01L 23/52* (2006.01)
*H01L 23/48* (2006.01)
*H01L 23/40* (2006.01)
*H01L 27/146* (2006.01)
*H01L 25/00* (2006.01)

(52) U.S. Cl.
CPC ....... *H01L 25/00* (2013.01); *H01L 2225/06562* (2013.01)

USPC .................. 257/777; 257/686; 257/E27.137; 257/E27.144

(58) Field of Classification Search
CPC ..................... H01L 25/00; H01L 2225/06562; H01L 2225/06565; H01L 2225/06568
USPC ........... 257/777–780, 686, E27.137, E27.144
See application file for complete search history.

(56) References Cited

U.S. PATENT DOCUMENTS 8,110,440 B2 * 2/2012 Bathan et al. ................. 438/109

FOREIGN PATENT DOCUMENTS

| KR | 1020060115583 A | 11/2006 |
|---|---|---|
| KR | 1020080077566 A | 8/2008 |
| KR | 1020090011969 A | 2/2009 |
| KR | 1020100096912 A | 9/2010 |

* cited by examiner

*Primary Examiner* — Luan C Thai
(74) *Attorney, Agent, or Firm* — William Park & Associates Patent Ltd.

(57) ABSTRACT

A semiconductor module comprising a plurality of semiconductor chips where at least one semiconductor chip is laterally offset with respect to a second semiconductor chip, and substantially aligned with a third semiconductor chip such that an electrical connection can be made between an electrical contact in the first semiconductor chip and an electrical contact in the third semiconductor chip.

4 Claims, 6 Drawing Sheets

SEMICONDUCTOR CHIP MODULE, SEMICONDUCTOR PACKAGE HAVING THE SAME AND PACKAGE MODULE

CROSS-REFERENCE TO RELATED APPLICATIONS

The present application claims priority to Korean patent application number 10-2011-0006900 filed on Jan. 24, 2011, which is incorporated herein by reference in its entirety.

BACKGROUND OF THE INVENTION

The present invention relates to a semiconductor chip module, a semiconductor package having the same and a package module, and more particularly, to a semiconductor chip module for high capacity packaging, a semiconductor package having the same, and a package module that can decrease the height of a semiconductor package to realize a package with high capacity.

In general, a semiconductor packaging technology means a technology for mounting a semiconductor chip on a printed circuit board (PCB) or manufacturing a semiconductor product by electrically connecting and packaging packages that include the PCB and the semiconductor chip. In the semiconductor industry, packaging technologies for semiconductor integrated circuits have been continuously developed to meet the demands toward miniaturization and mounting efficiency. Recently, various stacking techniques have been developed to meet the demands for miniaturization and the high functionality of electric and electronic products.

The term "stack" referred to in the semiconductor industry means to vertically place at least two semiconductor chips or a semiconductor package including the semiconductor chips. By using the stacking techniques, in the case of a memory device, it is possible to realize a product having memory capacity at least twice that obtainable through semiconductor integration processes, and mounting area utilization efficiency can also be increased.

However, in a semiconductor package manufactured using the conventional stack technology, connection members such as wires and bumps are needed for electrical connections and transfer of signals between semiconductor chips or packages. Due to the presence of the connection members, a problem is that the height of the semiconductor package increases.

For example, in the case where wires are formed as connection members for electrical connections between semiconductor chips or packages, a disadvantage is that since an additional area is required to perform a wire boning process on a printed circuit board, the size of a package increases. Also, another disadvantage is that since a gap is needed for the wire bonding process in the semiconductor chips or packages, the height of a semiconductor package increases.

Moreover, in the case where bumps are formed as connection members for electrical connections between semiconductor chips or packages, a disadvantage is that since the bumps need be placed between the semiconductor chips or packages, the height of a semiconductor package increases by the height of the bumps.

Accordingly, in the conventional semiconductor package, the connection members for electrical connections between the stacked semiconductor chips and packages are formed between the semiconductor chips and packages. Accordingly, the space utilization efficiency of a semiconductor package decreases, and the height of the semiconductor package increases. As a consequence, in the conventional art described above, it becomes harder to stack an increased number of semiconductor chips or packages to realize a package with high capacity.

BRIEF SUMMARY OF THE INVENTION

Embodiments of the present invention are directed to a semiconductor chip module for high capacity packages, a semiconductor package having the same, and a package module that can decrease the height of a semiconductor package while realizing a package with high capacity.

In one embodiment of the present invention, a semiconductor chip module includes a first semiconductor chip disposed face-up such that electrical contacts are on top. A second semiconductor chip is disposed face-up such that electrical contacts are on top, and disposed with a lateral offset over the first semiconductor chip such that at least one of the electrical contacts of the first semiconductor chip is not covered by the second semiconductor chip. A third semiconductor chip disposed face-down such that electrical contacts faces the electrical contacts of the second semiconductor chip, and disposed with a lateral offset over the second semiconductor chip such that at least one of the electrical contacts of the second semiconductor chip is not covered by the third semiconductor chip, and at least one of the electrical contacts of the third semiconductor chip is not covered by the second semiconductor chip. A fourth semiconductor chip is disposed face-down such that electrical contacts faces the third semiconductor chip, and disposed with a lateral offset over the third semiconductor chip such that at least one of the electrical contacts of the fourth semiconductor chip is not covered by the third semiconductor chip.

The semiconductor chip module may further include first connection members disposed between one of the non-covered electrical contacts of the first semiconductor chip and one of the non-covered electrical contacts of the third semiconductor chip to electrically connect the first semiconductor chip and the third semiconductor chip. Second connection members may be disposed between the second semiconductor chip and the third semiconductor chip to electrically connect the second semiconductor chip and the third semiconductor chip. Third connection members may be disposed between one of the non-covered electrical contacts of the second semiconductor chip and one of the non-covered electrical contacts of the fourth semiconductor chip to electrically connect the second semiconductor chip and the fourth semiconductor chip.

Each of the first through third connection members may be one of bumps, solder balls, or conductive posts.

The semiconductor chip module may further include an adhesive between the first semiconductor chip and the second semiconductor chip and between the third semiconductor chip and the fourth semiconductor chip.

The semiconductor chip module may further include an underfill member between the second semiconductor chip and the third semiconductor chip.

In another embodiment of the present invention, a semiconductor package may include a printed circuit board having an upper surface and a lower surface opposite the upper surface, and a semiconductor chip module mounted on the upper surface of the printed circuit board. The semiconductor chip module may comprise a first semiconductor chip disposed face-up such that electrical contacts are on top, on the upper surface of the printed circuit board. A second semiconductor chip may be disposed face-up such that electrical contacts are on top, and disposed with a lateral offset over the first semiconductor chip such that at least one of the electrical contacts of the first semiconductor chip is not covered by the second semiconductor chip. A third semiconductor chip may be disposed face-down such that electrical contacts faces the electrical contacts of the second semiconductor chip, and disposed with a lateral offset over the second semiconductor chip such that at least one of the electrical contacts of the second semiconductor chip is not covered by the third semiconductor chip, and at least one of the electrical contacts of the third semiconductor chip is not covered by the second semiconductor chip. A fourth semiconductor chip may be disposed face-down such that electrical contacts faces the third semiconductor chip, and disposed with a lateral offset over the third semiconductor chip such that at least one of the electrical contacts of the fourth semiconductor chip is not covered by the third semiconductor chip.

The semiconductor package may further include first connection members disposed between one of the non-covered electrical contacts of the first semiconductor chip and one of the non-covered electrical contacts of the third semiconductor chip to electrically connect the first semiconductor chip and the third semiconductor chip. Second connection members disposed between the second semiconductor chip and the third semiconductor chip to electrically connect the second semiconductor chip and the third semiconductor chip. Third connection members disposed between one of the non-covered electrical contacts of the second semiconductor chip and one of the non-covered electrical contacts of the fourth semiconductor chip to electrically connect the second semiconductor chip and the fourth semiconductor chip.

Each of the first through third connection members may be one of bumps, solder balls, or conductive posts.

The semiconductor package may further include interconnection members electrically connecting the first connection members with the printed circuit board and/or the third connection members with the printed circuit board.

The interconnection members may be at least one of wires, solders, and conductive pastes.

The semiconductor package may further include adhesives between the upper surface of the printed circuit board and the first semiconductor chip, between the first semiconductor chip and the second semiconductor chip, and between the third semiconductor chip and the fourth semiconductor chip.

The semiconductor package may further include an underfill member between the second semiconductor chip and the third semiconductor chip.

One or more semiconductor chip modules each including at least one semiconductor chip may be stacked on the upper surface of the printed circuit board.

The semiconductor package may further include an encapsulation member sealing the upper surface of the printed circuit board on which the semiconductor chip module is mounted and external connection terminals formed on the lower surface of the printed circuit board.

In another embodiment of the present invention, a package module includes a first package disposed face-up such that electrical contacts are on top, and a second package disposed face-up such that electrical contacts are on top, and disposed with a lateral offset over the first package such that at least one of the electrical contacts of the first package is not covered by the second package. A third package may be disposed face-down such that electrical contacts faces the electrical contacts of the second semiconductor chip, and disposed with a lateral offset over the second package such that at least one of the electrical contacts of the second package is not covered by the third package, and at least one of the electrical contacts of the third package is not covered by the second package. A fourth package disposed face-down such that electrical contacts faces the third semiconductor chip, and disposed with a lateral offset over the third package such that at least one of the electrical contacts of the fourth package is not covered by the third package.

The package module may further include first connection members disposed between one of the non-covered electrical contacts of the first package and one of the non-covered electrical contacts of the third package to electrically connect the first package and the third package. Second connection members may be disposed between the second package and the third package to electrically connect the second package and the third package and third connection members may be disposed between one of the non-covered electrical contacts of the second package and one of the non-covered electrical contacts of the fourth package to electrically connect the second package and the fourth package.

Each of the first through third connection members may be one of bumps, solder balls, or conductive posts.

The package module may further include adhesive between the first package and the second package and between the third package and the fourth package.

The package module may further include an underfill member between the second package and the third package.

The package module may further include at least a second package module disposed over the package module.

In another embodiment of the present invention, a semiconductor chip module comprises a plurality of semiconductor chips where at least one semiconductor chip is laterally offset with respect to a second semiconductor chip, and substantially aligned with a third semiconductor chip such that an electrical connection can be made between an electrical contact in the first semiconductor chip and an electrical contact in the third semiconductor chip.

In another embodiment of the present invention, a semiconductor package stack comprises a plurality of semiconductor packages where at least one semiconductor package is laterally offset with respect to a second semiconductor package, and substantially aligned with a third semiconductor package such that an electrical connection can be made between an electrical contact in the first semiconductor package and an electrical contact in the third semiconductor package.

In another embodiment of the present invention, a semiconductor package may comprise a plurality of semiconductor layers where each semiconductor layer comprises at least one semiconductor chip. At least one semiconductor layer may be laterally offset with respect to a second semiconductor layer, and substantially aligned with a third semiconductor layer such that an electrical connection can be made between an electrical contact in the first semiconductor layer and an electrical contact in the third semiconductor layer.

DESCRIPTION OF SPECIFIC EMBODIMENTS

In various embodiments of the present invention, in a semiconductor package in which a plurality of semiconductor chips or packages are stacked, the semiconductor chips or packages are electrically connected with one another by forming electrical connections between adjacent semiconductor chips or packages. As a consequence, it is possible to decrease the height of the semiconductor package, and, therefore, it is possible to realize a package with high capacity. To facilitate explanation, "semiconductor chips" will sometimes be stated in the descriptions below to mean that "packages" are also included, as in "semiconductor chips or packages"

In particular, in an embodiment of the present invention, among four semiconductor chips, lower two semiconductor chips are face-up, upper two semiconductor chips are face-down, and adjacent semiconductor chips are electrically connected with each other. As a consequence, it is possible to reduce the height of the semiconductor package by using connection members to connect the semiconductor chips.

Hereafter, specific embodiments of the present invention will be described in detail with reference to the accompanying drawings.

It is to be understood that the drawings are not necessarily to scale and in some instances proportions may have been exaggerated in order to more clearly depict certain features of the invention.

Figure 1:
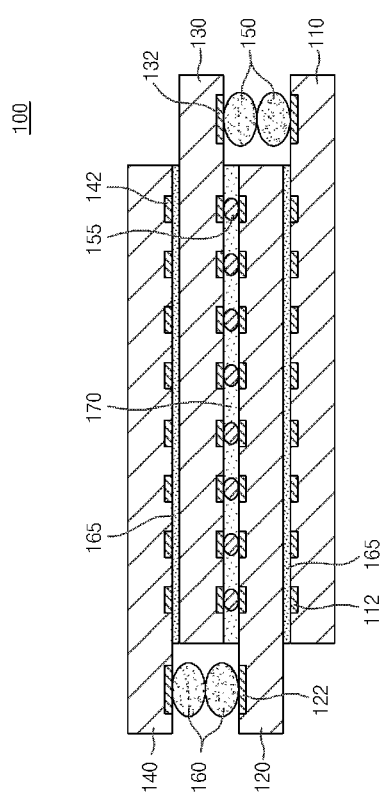
FIG. 1 is a cross-sectional view illustrating a semiconductor chip module in accordance with an embodiment of the present invention.

FIG. 1 is a cross-sectional view illustrating a semiconductor chip module in accordance with an embodiment of the present invention.

Referring to FIG. 1, a semiconductor chip module 100 includes first through fourth semiconductor chips 110, 120, 130 and 140, which are stacked bottom to top in order are to be electrically connected with one another.

The first semiconductor chip 110 has a plurality of first bonding pads 112 and is face-up such that the first bonding pads 112 of the first semiconductor chip 110 are on top.

The second semiconductor chip 120 is coupled to the first semiconductor chip 110 by an adhesive 165. The second semiconductor chip 120 is also face-up with a plurality of second bonding pads 122 on top. Furthermore, the second semiconductor chip 120 may be laterally offset with respect to the first semiconductor chip 110 such that at least of the first bonding pads 112 may not be covered by the second semiconductor chip 120. The phrase "laterally offset" may mean offset in one or two dimensions.

Although not shown in a drawing, it is conceivable that the non-covered first bonding pads 112 may include pads that are redistributed from other adjacent first bonding pads 112.

The third semiconductor chip 130 may be placed face-down over the second semiconductor chip 120 such that a plurality of third bonding pads 132 faces the second bonding pads 122 of the second semiconductor chip 120. Further, the third semiconductor chip 130 may be laterally offset with respect to the second semiconductor chip 120 such that it may be substantially in line with the first semiconductor chip 110. Accordingly, at least one of the second bonding pads 122 may not be covered by the third semiconductor chip 130. Furthermore, at least one of the third bonding pads 132 may not be covered by the first semiconductor chip 110 and may line up with a corresponding one of the non-covered first bonding pads 112.

Although not shown in a drawing, it is conceivable that the non-covered second bonding pads 122 may include pads that are redistributed from other adjacent second bonding pads 122.

First connection members 150 are disposed between the non-covered first bonding pads 112 and the non-covered third bonding pads 132 of the third semiconductor chip 130. The first semiconductor chip 110 and the third semiconductor chip 130 may then be electrically connected with each other by the first connection members 150.

Also, second connection members 155 are disposed between the second bonding pads 122 of the second semiconductor chip 120 and the third bonding pads 132 of the third semiconductor chip 130 that are disposed to face each other. With the second connection members 155 in place, an underfill member 170 is formed between the second semiconductor chip 120 and the third semiconductor chip 130. The second semiconductor chip 120 and the third semiconductor chip 130 are electrically connected with each other by the second connection members 155.

As a consequence, the third semiconductor chip 130 is electrically connected with the first and second semiconductor chips 110 and 120 through the first and second connection members 150 and 155, respectively. For example, each of the first and second connection members 150 and 155 may be one of bumps, solder balls, or conductive posts.

A fourth semiconductor chip 140 may be attached face-down to the third semiconductor chip 130 with an adhesive 165. Accordingly, the fourth semiconductor chip 140 has a plurality of fourth bonding pads 142 that face the third semiconductor chip 130. Furthermore, the fourth semiconductor chip 140 may be offset laterally with respect to the third semiconductor chip 130 such that it is substantially in line with the second semiconductor chip 120. At least one of the fourth bonding pads 142 may not be covered by the third semiconductor chip 130 and may line up with a corresponding non-covered second bonding pad 122.

Third connection members 160 are disposed between the non-covered second bonding pads 122 of the second semiconductor chip 120 and the corresponding non-covered fourth bonding pads 142 of the fourth semiconductor chip 140 that face the second bonding pads 122. The second semiconductor chip 120 and the fourth semiconductor chip 140 are electrically connected with each other by the third connection members 160. For example, each of the third connection members 160 may be one of bumps, solder balls, or conductive posts.

As described above, in the semiconductor chip module 100 in accordance with the embodiment of the present invention, the first through fourth semiconductor chips 110, 120, 130 and 140 are sequentially stacked such that the first and second semiconductor chips 110 and 120 are disposed face-up, and the third and fourth semiconductor chips 130 and 140 are disposed face-down. Furthermore, the first semiconductor chip 110 and the third semiconductor chip 130 are electrically connected with each other, the second semiconductor chip 120 and the fourth semiconductor chip 140 are electrically connected with each other, and the second semiconductor chip 120 and the third semiconductor chip 130, which face each other, are electrically connected with each other.

Therefore, the first connection members 150 that electrically connect the first semiconductor chip 110 and the third semiconductor chip 130 can be disposed in the same layer as the second semiconductor chip 120, and the third connection members 160 that electrically connect the second semiconductor chip 120 and the fourth semiconductor chip 140 can be disposed in the same layer as the third semiconductor chip 130.

Accordingly, in an embodiment of the present invention, because the height of the first and third connection members 150 and 160 do not increase the overall height of the semiconductor chip module 100, it is possible to increase capacity of chip modules.

Meanwhile, although not shown in a drawing, it is conceivable that at least two semiconductor chip modules 100 may be stacked.

Figure 2:
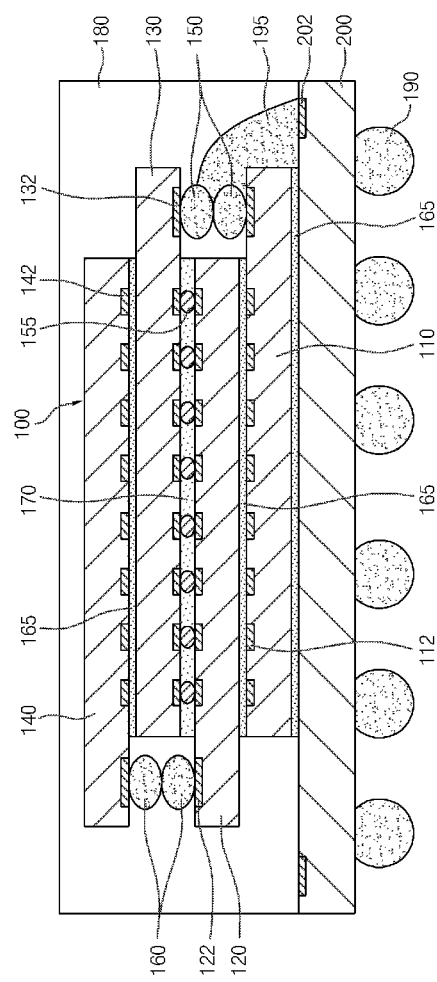
FIG. 2 is a cross-sectional view illustrating a semiconductor package having a semiconductor chip module in accordance with another embodiment of the present invention.

FIG. 2 is a cross-sectional view illustrating a semiconductor package having a semiconductor chip module in accordance with another embodiment of the present invention.

Referring to FIG. 2, a semiconductor chip module 100 including first through fourth semiconductor chips 110, 120, 130 and 140 is mounted to the upper surface of a printed circuit board 200 which has an upper surface and a lower surface.

The semiconductor chip module 100 may be similar to the semiconductor chip module 100 shown in FIG. 1. In detail, the semiconductor chip module 100 includes the first semiconductor chip 110 disposed face-up over the upper surface of the printed circuit board 200 using adhesive 165 and the second semiconductor chip 120 disposed face-up over the first semiconductor chip 110 using adhesive 165 in such a manner that at least one of the first bonding pads 112 are not covered by the second semiconductor chip 120. The third semiconductor chip 130 is disposed face-down over the second semiconductor chip 120 using an underfill member 170, where at least one of the second bonding pads 122 are not covered by the third semiconductor chip 130. The third semiconductor chip 130 may also be substantially aligned with the first semiconductor chip 110. The fourth semiconductor chip 140 is disposed face-down over the third semiconductor chip 130 using adhesive 165 such that at least one of the fourth bonding pads 142 is not covered by the third semiconductor chip 130. The fourth semiconductor chip 140 may also be substantially aligned with the second semiconductor chip 120.

First connection members 150 are disposed between the non-covered first bonding pads 112 of the first semiconductor chip 110 and the corresponding non-covered third bonding pads 132 of the third semiconductor chip 130. The first semiconductor chip 110 and the third semiconductor chip 130 are electrically connected with each other by the first connection members 150.

Second connection members 155 are disposed between second bonding pads 122 of the second semiconductor chip 120 and the corresponding third bonding pads 132 of the third semiconductor chip 130 that face the second bonding pads 122. The second semiconductor chip 120 and the third semiconductor chip 130 are electrically connected with each other by the second connection members 155.

Third connection members 160 are disposed between the non-covered second bonding pads 122 and the corresponding non-covered fourth bonding pads 142 of the fourth semiconductor chip 140. The second semiconductor chip 120 and the fourth semiconductor chip 140 are electrically connected with each other by the third connection members 160.

As a consequence, the third semiconductor chip 130 is electrically connected with the first and second semiconductor chips 110 and 120 by the first and second connection members 150 and 155, respectively, and the fourth semiconductor chip 140 is electrically connected with the second semiconductor chip 120 by the third connection members 160. Each of the first through third connection members 150, 155 and 160 may be one of bumps, solder balls, or conductive posts.

Interconnection members 195 are formed to electrically connect the semiconductor chip module 100 including the first through fourth semiconductor chips 110, 120, 130 and 140 with bond fingers 202 of the printed circuit board 200 on which the semiconductor chip module 100 is disposed.

In detail, the interconnection members 195 are formed in such a way as to electrically connect the first connection members 150 disposed between the first and third semiconductor chips 110 and 130 with the bond fingers 202 of the printed circuit board 200. Each of the interconnection members 195 may be one of wires, solders, or conductive pastes.

An encapsulation member 180 is formed on the upper surface of the printed circuit board 200 on which the semiconductor chip module 100 is mounted, and external connection terminals 190 are formed on the lower surface of the printed circuit board 200.

As described above, in the semiconductor package in accordance with an embodiment of the present invention, the first connection members 150 that electrically connect the first semiconductor chip 110 and the third semiconductor chip 130 can be disposed in the same layer as the second semiconductor chip 120 between the first semiconductor chip 110 and the third semiconductor chip 130. Similarly, the third connection members 160 that electrically connect the second semiconductor chip 120 and the fourth semiconductor chip 140 can be disposed in the same layer as the third semiconductor chip 130 between the second semiconductor chip 120 and the fourth semiconductor chip 140.

Accordingly, in an embodiment of the present invention, the height of connecting the first and third connection members 150 and 160 does not increase the height of the semiconductor package, it is possible to realize a semiconductor package with high capacity.

It was stated above that the interconnection members 195 electrically connect the first connection members 150 with the bond fingers 202 of the printed circuit board 200. However, various embodiments of the present invention may also have interconnection members 195 formed to electrically connect the third connection members 160 with the bond fingers 202 of the printed circuit board 200.

Figure 3:
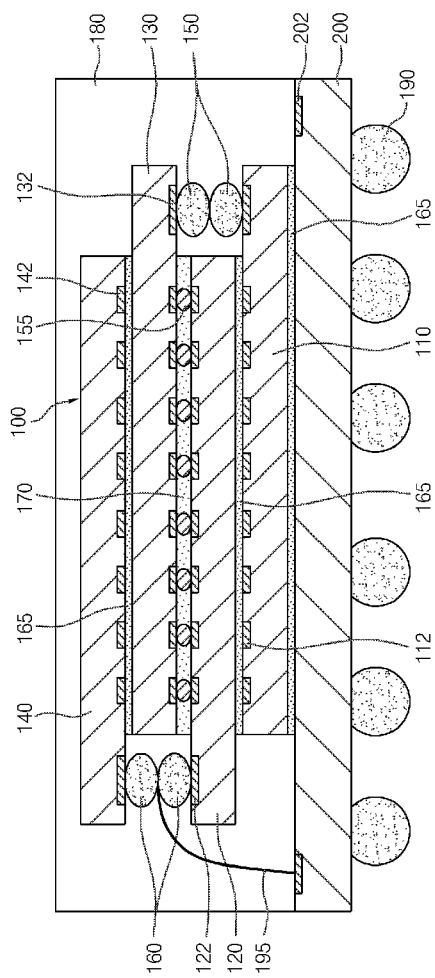
FIG. 3 is a cross-sectional view illustrating a semiconductor package having a semiconductor chip module in accordance with another embodiment of the present invention.

FIG. 3 is a cross-sectional view illustrating a semiconductor package having a semiconductor chip module in accordance with another embodiment of the present invention.

Referring to FIG. 3, third connection members 160 are formed between a second semiconductor chip 120 and a fourth semiconductor chip 140 which are disposed to face each other, and interconnection members 195 are formed to electrically connect the third connection members 160 with bond fingers 202 of a printed circuit board 200.

The interconnection members 195 include any of, for example, wires, solders, and conductive pastes. Accordingly, a semiconductor chip module 100 including first through fourth semiconductor chips 110, 120, 130 and 140 and the printed circuit board 200 are electrically connected with each other.

It was described above that the interconnection members 195 are formed to electrically connect the first connection members 150 with the bond fingers 202 of the printed circuit board 200 or the third connection members 160 with the bond fingers 202 of the printed circuit board 200. However, although not shown in a drawing, the interconnection members 195 may be formed to electrically connect the first connection members 150 with the bond fingers 202 of the printed circuit board 200 and also the third connection members 160 with the bond fingers 202 of the printed circuit board 200.

Furthermore, while it was described above that one semiconductor chip module 100 including the first through fourth semiconductor chips 110, 120, 130 and 140 is mounted on the printed circuit board 200, various embodiments of the present invention may comprise at least two semiconductor chip modules 100 stacked on the printed circuit board 200.

Figure 4:
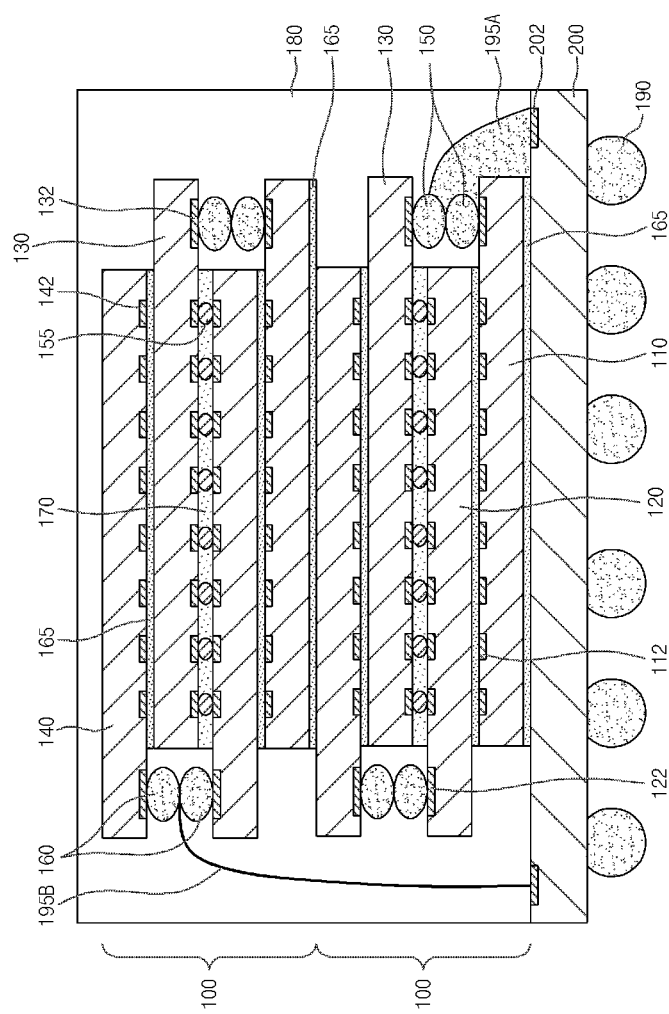
FIG. 4 is a cross-sectional view illustrating a semiconductor package having a semiconductor chip module in accordance with another embodiment of the present invention.

FIG. 4 is a cross-sectional view illustrating a semiconductor package having a semiconductor chip module in accordance with another embodiment of the present invention.

Referring to FIG. 4, two semiconductor chip modules 100, with each semiconductor chip modules 100 as shown in FIG. 1 and including first through fourth semiconductor chips 110, 120, 130 and 140, are mounted on a printed circuit board 200. The semiconductor chip modules 100 may be attached together using the adhesive 165. First interconnection members 195A are formed to electrically connect one of the two semiconductor chip modules 100 with bond fingers 202 of the printed circuit board 200, and second interconnection members 195B are formed to electrically connect the other of the two semiconductor chip modules 100 with bond fingers 202 of the printed circuit board 200.

The first and second interconnection members 195A and 195B may include any of wires, solders, and conductive pastes. For example, the first interconnection members 195A may be conductive pastes, and the second interconnection members 195B may be wires.

Although not shown in a drawing, various embodiments of the invention may comprise stacking at least three semiconductor chip modules 100 on the printed circuit board 200, where the adhesives 165 may be used to attach adjacent semiconductor chip modules 100 with each other.

While various embodiments of the present invention for a stack structure comprising the semiconductor chip module 100 was described above, the present invention is not limited to such embodiments. For example, the stack structure may comprise packages that are stacked to be electrically connected with one another.

Figure 5:
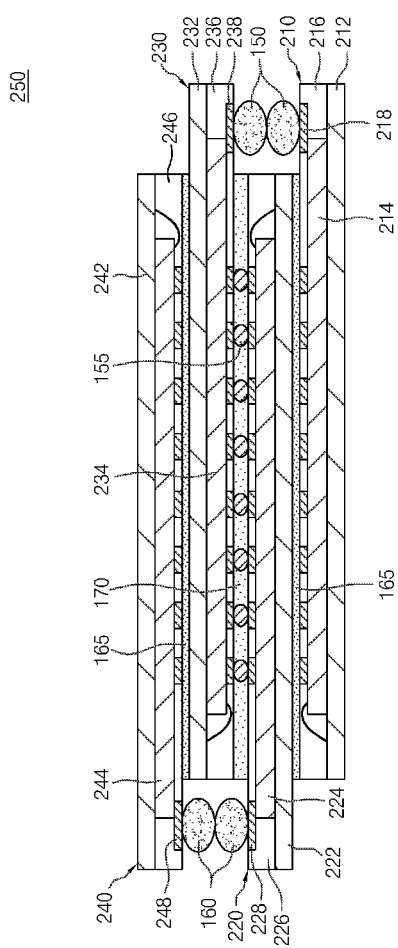
FIG. 5 is a cross-sectional view illustrating a package module with a package stack structure in accordance with another embodiment of the present invention.

FIG. 5 is a cross-sectional view illustrating a package module with a package stack structure in accordance with another embodiment of the present invention.

Referring to FIG. 5, a package module 250 includes first through fourth packages 210, 220, 230, and 240 that are stacked to be electrically connected with one another.

The first package 210 may comprise a first substrate 212, a first chip 214 mounted on the first substrate 212, and a first encapsulation member 216 that seals one surface of the first substrate 212 having the first chip 214 mounted thereon. The first package 210 has first pads 218 electrically connected with the first chip 214, and is disposed face-up such that the surface having the first pads 218 is directed upward.

The second package 220 is disposed over the first package 210 with an adhesive 165. The second package 220 includes a second substrate 222, a second chip 224 mounted on the second substrate 222, and a second encapsulation member 226 that seals one surface of the second substrate 222 having the second chip 224 mounted thereon.

The second package 220 has second pads 228 electrically connected with the second chip 224, and is disposed face-up such that the surface having the second pads 228 is directed upward. Furthermore, the second package 220 is laterally offset with respect to the first package 210 such that at least one of the first pads 218 is not covered by the second package 220.

The third package 230 is disposed over the second package 220 with an underfill member 170. The third package 230 includes a third substrate 232, a third chip 234 mounted on the third substrate 232, and a third encapsulation member 236 that seals one surface of the third substrate 232 having the third chip 234 mounted thereon. The third package 230 has third pads 238 electrically connected with the third chip 234, and is disposed face-down such that the surface having the third pads 238 is directed downward. Further, the third package 230 is laterally offset with respect to the second package 220 such that at least one of the second pads 228 is not covered by the third package 230. Similarly, at least one of the third pads 238 is not covered by the second package 220.

The fourth package 240 is disposed over the third package 230 with an adhesive 165. The fourth package 240 includes a fourth substrate 242, a fourth chip 244 mounted on the fourth substrate 242, and a fourth encapsulation member 246 that seals one surface of the fourth substrate 242 having the fourth chip 244 mounted thereon. The fourth package 240 has fourth pads 248 electrically connected with the fourth package 240, and is disposed face-down such that the surface having the fourth pads 248 is directed downward. Further, the fourth package 240 is laterally offset with respect to the third package 230 such that at least one of the fourth pads 248 is not covered by the third package 230.

First connection members 150 are formed between the non-covered first pads 218 of the first package 210 and the corresponding non-covered third pads 238 of the third package 230. Second connection members 155 are formed between the second pads 228 of the second package 220 and the corresponding third pads 238 of the third package 230. Accordingly, the third package 230 is electrically connected with the first and second packages 210 and 220 by the first and second connection members 150 and 155.

Third connection members 160 are formed between the non-covered second pads 228 of the second package 220 and the corresponding non-covered fourth pads 248 of the fourth package 240. Accordingly, the fourth package 240 is electrically connected with the second package 220 by the third connection members 160. Each of the first through third connection members 150, 155 and 160 may be one of bumps, solder balls, or conductive posts.

In various embodiments of the present invention, the first through fourth chips 214, 224, 234 and 244 of the first through fourth packages 210, 220, 230 and 240 may be electrically connected with the first through fourth substrates 212, 222, 232 and 242, respectively, by various structures such as, for example, bonding wires.

Moreover, while it was illustrated that each of the packages comprises a single chip to facilitate description, the invention need not be so limited. Each of the packages may comprise one or more chips as described with respect to FIGS. 1-4.

Furthermore, while a package stack structure in accordance with an embodiment of the present invention comprising a single package module in each of the first through fourth packages 210, 220, 230 and 240 was described, various embodiments of the present invention may comprise at least two package modules in each of the first through fourth packages 210, 220, 230 and 240.

Figure 6:
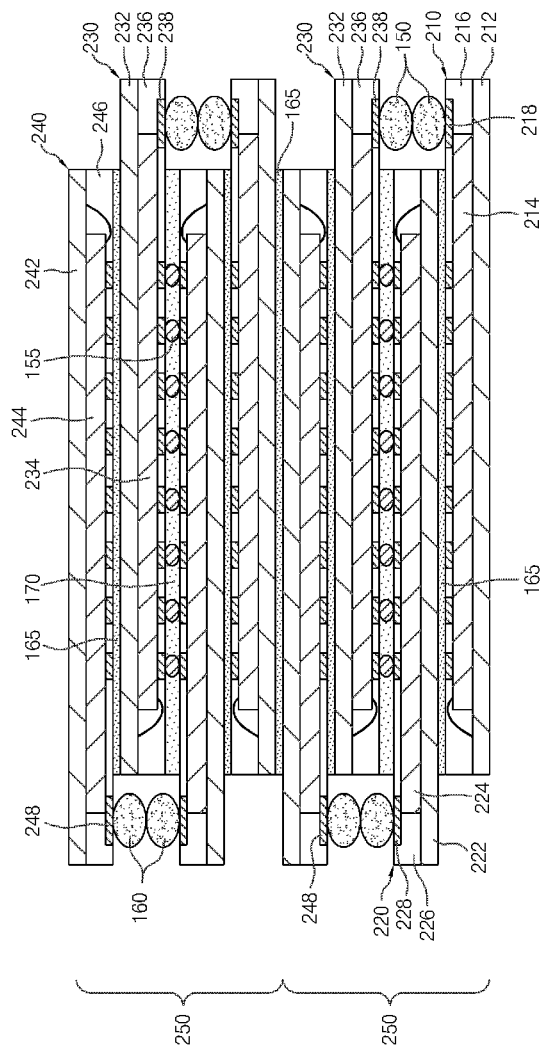
FIG. 6 is a cross-sectional view illustrating a package module with a package stack structure in accordance with another embodiment of the present invention.

FIG. 6 is a cross-sectional view illustrating a package module with a package stack structure in accordance with another embodiment of the present invention.

Referring to FIG. 6, on a fourth package 240 of a package module 250 including the first through fourth packages 210, 220, 230 and 240 described with respect to FIG. 5, there may additionally be stacked at least one package module 250 including first through fourth packages 210, 220, 230 and 240 that are disposed in the similar manner the adhesive 165.

Connection members (not shown) may be formed to electrically connect the package modules 250 with each other. The connection members include, for example, any of wires, solders, and conductive pastes. While not shown in a drawing, at least three package modules 250 may be stacked using the adhesives 165.

Various embodiments of the invention have been illustrated and described to show electrical connections between non-covered bonding pads. Because the illustrations show connections using, for example, connection members connecting non-covered bonding pads from a side view, it may be thought that these bonding pads are directly over one another. However, the invention need not be so limited. For example, where the non-covered bonding pads are not offset from each other, they may be connected using such structures as wires.

Furthermore, the term "lateral offset" may also be used to describe two chips or packages that do not align on all sides. For example, with respect to FIG. 1, a case can be assumed where the right edge of the fourth semiconductor chip 140 is substantially aligned with the right edge of the third semiconductor chip 130. However, because the left edges of the third and fourth semiconductor chips 130 and 140 do not align with each other, the third and fourth semiconductor chips 130 and 140 may be said to be "laterally offset" with respect to each other.

Also, while various embodiments of the invention have shown adjacent layers laterally offset with respect to each other, the invention need not be so limited. For example, in FIG. 1, the third semiconductor chip 130 may be aligned with the second semiconductor chip 120, and hence laterally offset with respect to the first semiconductor chip 110. The fourth semiconductor chip 140 may be aligned with the first semiconductor chip 110, and hence laterally offset with respect to the second and third semiconductor chips 120 and 130. Accordingly, connection members may electrically connect a non-covered bonding pad in the first semiconductor chip 110 with a non-covered bonding pad in the fourth semiconductor chip 140.

Additionally, various embodiments of the invention may comprise structures where different layers of chips or packages are laterally offset with respect to each other. Also, a single package may comprise at least one chip, module, and/or package.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor chip module comprising:
   a first semiconductor chip disposed face-up, wherein a semiconductor chip comprises electrical contacts on top when it is face-up;
   a second semiconductor chip disposed face-up with a lateral offset over the first semiconductor chip such that at least one of the electrical contacts of the first semiconductor chip is not covered by the second semiconductor chip;
   a third semiconductor chip disposed face-down with a lateral offset over the second semiconductor chip such that at least one of the electrical contacts of the second semiconductor chip is not covered by the third semiconductor chip, and at least one of the electrical contacts of the third semiconductor chip is not covered by the second semiconductor chip; and
   a fourth semiconductor chip disposed face-down with a lateral offset over the third semiconductor chip such that at least one of the electrical contacts of the fourth semiconductor chip is not covered by the third semiconductor chip; and
   adhesives between the first semiconductor chip and the second semiconductor chip, and between the third semiconductor chip and the fourth semiconductor chip,
   wherein the second semiconductor chip is coupled to the first semiconductor chip by interposing only the adhesive, and the fourth semiconductor chip is attached to the third semiconductor chip by interposing only the adhesive.

2. The semiconductor chip module according to claim 1, further comprising:
   first connection members disposed between one of the non-covered electrical contacts of the first semiconductor chip and one of the non-covered electrical contacts of the third semiconductor chip to electrically connect the first semiconductor chip and the third semiconductor chip;
   second connection members disposed between the second semiconductor chip and the third semiconductor chip to electrically connect the second semiconductor chip and the third semiconductor chip; and
   third connection members disposed between one of the non-covered electrical contacts of the second semiconductor chip and one of the non-covered electrical contacts of the fourth semiconductor chip to electrically connect the second semiconductor chip and the fourth semiconductor chip.

3. The semiconductor chip module according to claim 2, wherein the first through third connection members comprise at least one of bumps, solder balls, and conductive posts.

4. The semiconductor chip module according to claim 1, further comprising:
   an underfill member between the second semiconductor chip and the third semiconductor chip.

* * * * *